United States Patent
Kushiyama

(10) Patent No.: US 7,616,075 B2
(45) Date of Patent: Nov. 10, 2009

(54) PHASE LOCKED LOOP CIRCUIT HAVING REGULATOR

(75) Inventor: Natsuki Kushiyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 20 days.

(21) Appl. No.: 12/042,069

(22) Filed: Mar. 4, 2008

(65) Prior Publication Data

US 2008/0284524 A1 Nov. 20, 2008

(30) Foreign Application Priority Data

Mar. 5, 2007 (JP) ............................ P2007-054761

(51) Int. Cl.
*H03L 1/00* (2006.01)
(52) U.S. Cl. ........................................ 331/186; 331/44
(58) Field of Classification Search ................. 331/186, 331/185, 44, 34
See application file for complete search history.

(56) References Cited

U.S. PATENT DOCUMENTS

2002/0075080 A1* 6/2002 Nelson et al. ................. 331/11
2002/0167367 A1* 11/2002 Ingino, Jr. ................... 331/186

FOREIGN PATENT DOCUMENTS

| JP | 2001-339298 A | 5/2000 |
|---|---|---|
| JP | 2004-112157 A | 9/2002 |
| JP | 2006-25131 A | 7/2004 |

* cited by examiner

*Primary Examiner*—Joseph Chang
(74) *Attorney, Agent, or Firm*—Sprinkle IP Law Group

(57) ABSTRACT

Embodiments of present invention provide a circuit including a voltage regulator, a phase frequency detector, a charge pump, a low pass filter a control-voltage generating circuit and a voltage controlled oscillator. In a first mode of operation the voltage controlled oscillator produces an output clock in accordance with a control voltage produced from the control-voltage generating circuit and the output voltage of the voltage regulator. In a second mode of operation, the voltage controlled oscillator produces an output clock in accordance with a control voltage from the low pass filter and the output voltage of the voltage regulator.

25 Claims, 8 Drawing Sheets

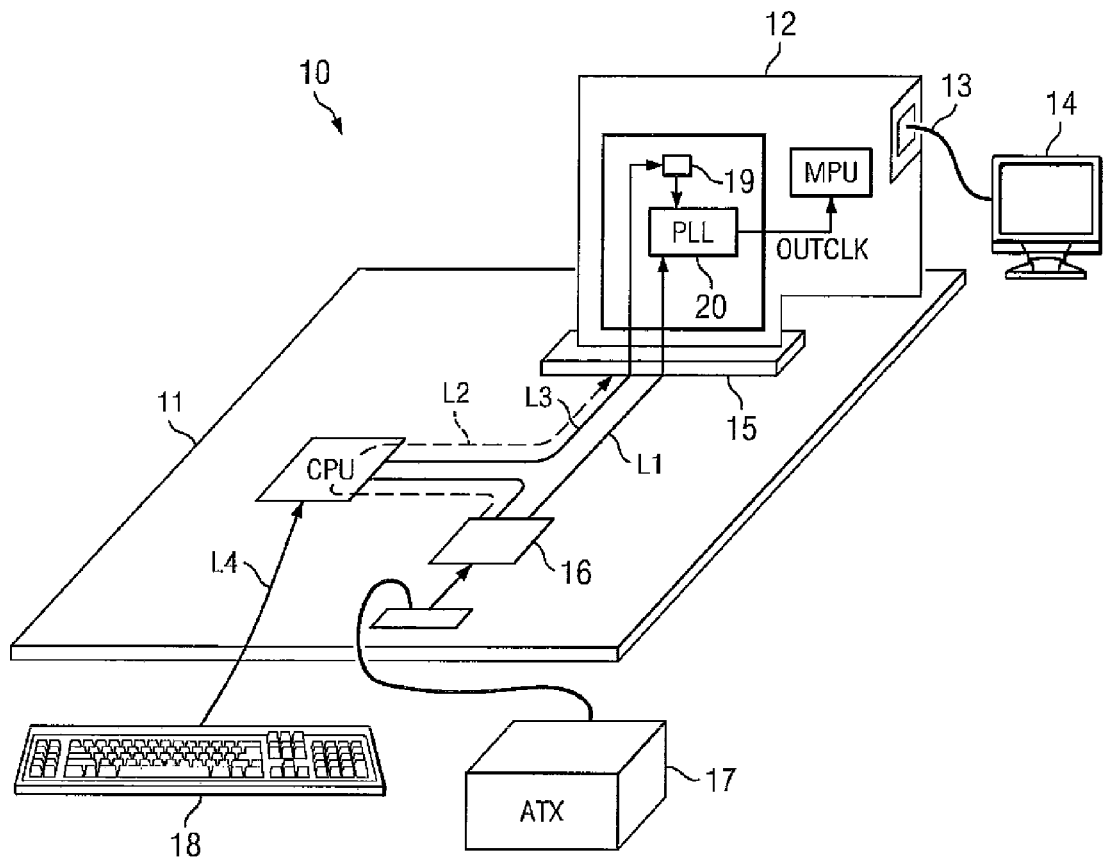
FIG. 1
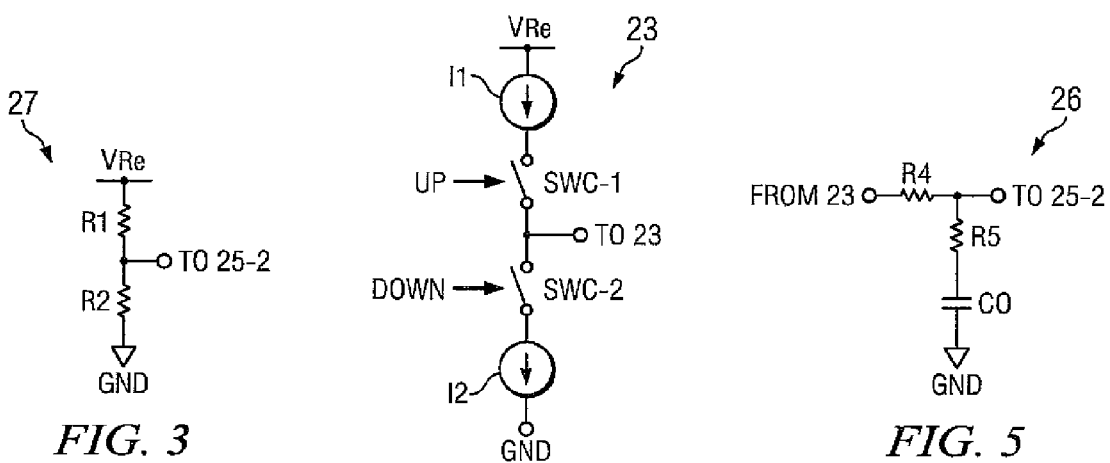
FIG. 3
FIG. 4
FIG. 5

PHASE LOCKED LOOP CIRCUIT HAVING REGULATOR

CROSS-REFERENCE TO RELATED APPLICATIONS

This application is based upon and claims the benefit of priority from the prior Japanese Patent Application No. P2007-54761, filed Mar. 5, 2007, the entire contents of which are incorporated herein by reference.

BACKGROUND OF THE INVENTION

1. Field of the Invention

The present invention relates to a PLL (Phase Locked Loop) circuit, and is applied to, for example, a PLL circuit driven by a power-supply voltage supplied from a voltage regulator.

2. Description of the Related Art

A PLL circuit, which outputs a signal at an integral multiple of the frequency of an input signal to generate a high-speed clock for an IC (Integrated Circuit) chip such as LSI and DSP (Digital Signal Processor), is widely used.

The PLL circuit is used to convert an externally inputted reference clock with a voltage controlled oscillator (herein referred to as VCO) and thereby to output the converted clock as a predetermined output clock. For example, Japanese Patent Application Publication No. 2004-112157 describes the VCO which is driven by a power-supply voltage supplied from a voltage regulator or the like. The voltage regulator is provided for reducing the change in a driving voltage for the VCO even when an external power-supply voltage is changed.

The oscillation frequency of the VCO is proportional to a control voltage (Vctrl) applied to a control terminal, and to a driving voltage (VRe) supplied from a regulator or the like.

How much the oscillation frequency is changed when the control voltage (Vctrl) is changed by a unit voltage, is generally called KVCO. When the KVCO is large, a slight change in the control voltage (Vctrl) causes the frequency of the output clock of the VCO to be changed. The change in frequency is nothing but the change in phase. Accordingly, a jitter is increased. It is desirable that the jitter be reduced as much as possible.

In the meanwhile, the frequency of the reference clock externally inputted to the PLL circuit is changed in some case when the power is supplied on or in a predetermined test mode. In this case, the band width of the operating frequency range (fVCO) of the PLL circuit needs to be increased in response to the above change. Nonetheless, in order to increase the band width of the operating frequency range (fVCO), the KVCO which is equivalent to the gradient of the operating frequency range (fVCO) theoretically needs to be increased. On the other hand, when the KVCO is increased, a jitter is consequently increased as described above. Thus, it is generally a conflicting requirement to reduce the jitter and to increase the band width of the operating frequency of the PLL circuit at the same time.

In addition, according to the above relationship, the oscillation frequency of the VCO increases with the increase in the driving voltage (VRe), and decreases with the decrease in the driving voltage (VRe).

Accordingly, when the output voltage (VRe) of the voltage regulator or the like is changed due to a variation in the production process, the characteristic line of the oscillation frequency is shifted up or down. This results in a problem that an oscillation frequency range (operating frequency range) to be guaranteed is consequently narrowed, in considering the change in the oscillation frequency due to the variation in the production process for the voltage regulator or the like.

As described above, the conventional PLL circuit has a problem that the oscillation frequency range cannot be expanded while the jitter is kept low.

In considering the amount of change in the output voltage (VRe) supplied from the voltage regulator due to the variation in the production process, the guaranteed usable range of the output voltage from the voltage regulator is to be limited, also resulting in a problem of the narrowed oscillation frequency range (operating frequency range) of the VCO.

BRIEF SUMMARY OF THE INVENTION

According to one aspect of the present invention, there is provided a circuit which comprises a voltage regulator configured to provide an output voltage, a phase frequency detector configured to compare phases and frequencies between a reference clock and a feedback clock, and outputs a clock resulting from the comparison on an output, a charge pump configured to output an electric charge in accordance with the output from the phase frequency detector, a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the charge pump in a second mode of operation and switch between the first mode of operation and the second mode of operation, a low pass filter configured to store the electric charge injected from the charge pump to output a first control voltage on an output, a control-voltage generating circuit configured to output a second control voltage on an output, wherein the second control voltage is obtained by dividing the output voltage of the voltage regulator, a voltage controlled oscillator configured to output an output clock, a second path setting section configured to couple the output of the control-voltage generating circuit to the voltage controlled oscillator in a first mode of operation, couple the output of the low pass filter to the voltage controlled oscillator in a second mode of operation and switch between the first mode of operation and the second mode of operation such that the voltage controlled oscillator produces the output clock in accordance with the second control voltage and the output voltage of the voltage regulator in the first mode of operation and the voltage controlled oscillator produces the output clock in accordance with the first control voltage and the output voltage of the voltage regulator in the second mode of operation and a divider configured to output the feedback clock, wherein the feedback clock is obtained by dividing the output clock of the voltage controlled oscillator to the phase frequency detector.

According to another aspect of the present invention there is provided a circuit comprising a voltage regulator configured to provide an output voltage based upon a register, a phase frequency detector configured to compare phases and frequencies between a reference clock and a feedback clock, and outputs a clock resulting from the comparison on an output, a charge pump configured to output an electric charge on an output in accordance with the output from the phase frequency detector, a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the charge pump in a second mode of operation and switch between the first mode of operation and the second mode of operation, a low pass filter configured to store the electric charge output from the charge pump to output a first control voltage on an output, a control-voltage generating circuit configured to output a second control voltage on an output, wherein the second control voltage is obtained by dividing the output voltage of the voltage regulator, a voltage controlled oscillator configured to output an output clock, a second path setting section configured to couple the output of the control-voltage generating circuit to the low pass filter in the first mode of operation, de-couple the output of the control-voltage generating circuit from the low pass filter in the second mode of operation and switch between the first mode of operation and the second mode of operation such that the output of the voltage controlled oscillator is based on the output of the charge pump and the second control voltage in the first mode of operation and on the output of the charge pump in the second mode of operation.

According to another aspect of the present invention, there is provided a circuit comprising a voltage regulator configured to provide an output voltage based upon a register, a phase frequency detector configured to compare phases and frequencies between a reference clock and a feedback clock, and outputs a clock resulting from the comparison on an output, a first charge pump configured to output an electric charge in accordance with the output from the phase frequency detector, a second charge pump configured to output an electric charge in accordance with the output from the phase frequency detector, a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the first charge pump and the second charge pump in a second mode of operation and switch between the first mode of operation and the second mode of operation, a first low pass filter configured to store the electric charge injected from the first charge pump to output a first control voltage on an output, a second low pass filter configured to store the electric charge injected from the second charge pump to output a second control voltage on an output, a first control-voltage generating circuit configured to output a third control voltage on an output, wherein the third control voltage is obtained by dividing the output voltage of the voltage regulator, a second control-voltage generating circuit configured to output a fourth control voltage on an output, wherein the fourth control voltage is obtained by dividing the output voltage of the voltage regulator, a differential voltage controlled oscillator which outputs an output clock, a second path setting section configured to couple the output of the first control-voltage generating circuit and the output of the second control-voltage generating circuit to the voltage controlled oscillator in the first mode of operation, couple the output of the first low pass filter and the output of the second low pass filter to the voltage controlled oscillator in the second mode of operation and switch between the first mode of operation and the second mode of operation such that the voltage controlled oscillator produces the output clock in accordance with the third control voltage, the fourth control voltage and the output voltage of the voltage regulator in the first mode of operation and produces the output clock in accordance with the first control voltage, the second control voltage and the output voltage of the voltage regulator in the second mode of operation and a divider which outputs the feedback clock, wherein the feedback clock is obtained by dividing the output clock of the voltage controlled oscillator to the phase frequency detector.

According to another aspect of the present invention, there is provided a method of operating a circuit comprising switching between a first mode of operation and a second mode of operation based on an event wherein the first mode of operation comprises: regulating an output voltage of a voltage regulator based upon an output of a phase frequency detector, providing a second control voltage to a voltage controlled oscillator, wherein the first control voltage is obtained by dividing the output voltage of the voltage regulator, and producing an output clock from a voltage controlled oscillator in accordance with the first control voltage and the output voltage of the voltage regulator and the second mode of operation comprises: providing the output of a phase frequency detector to a charge pump configured to produce an electric charge in accordance with the output from the phase frequency detector, providing a second control voltage to the voltage controlled oscillator from a low pass filter configured to store the electric charge injected from the charge pump and produce the second control voltage, providing the output voltage of a voltage regulator to the voltage controlled oscillator and producing the output clock from the voltage controlled oscillator in accordance with the second control voltage and the output voltage of the voltage regulator.

According to another aspect of the present invention, there is provided a system comprising a CPU configured to produce a mode signal, a power-supply detecting circuit configured to determine a power-supply voltage and produce the mode signal based upon the determined power-supply voltage and a PLL circuit which outputs a clock signal based upon the mode signal, the PLL circuit including: a voltage regulator configured to provide an output voltage based upon a register, a phase frequency detector configured to compare phases and frequencies between a reference clock and a feedback clock, and outputs a clock resulting from the comparison on an output, a charge pump configured to output an electric charge in accordance with the output from the phase frequency detector, a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the charge pump in a second mode of operation and switch between the first mode of operation and the second mode of operation based upon the mode signal, a low pass filter configured to store the electric charge injected from the charge pump to output a first control voltage on an output, a control-voltage generating circuit configured to output a second control voltage on an output, wherein the second control voltage is obtained by dividing the output voltage of the voltage regulator, a voltage controlled oscillator configured to output an output clock, a second path setting section configured to couple the output of the control-voltage generating circuit to the voltage controlled oscillator in a first mode of operation, couple the output of the low pass filter to the voltage controlled oscillator in a second mode of operation and switch between the first mode of operation and the second mode of operation based upon the mode signal such that the voltage controlled oscillator produces the output clock in accordance with the second control voltage and the output voltage of the voltage regulator in the first mode of operation and the voltage controlled oscillator produces the output clock in accordance with the first control voltage and the output voltage of the voltage regulator in the second mode of operation and a divider configured to output the feedback clock, wherein the feedback clock is obtained by dividing the output clock of the voltage controlled oscillator to the phase frequency detector.

BRIEF DESCRIPTION OF THE SEVERAL VIEWS OF THE DRAWING

A more complete appreciation of the invention and many of the attendant advantages thereof will be readily obtained as the same becomes better understood by reference to the following detailed description when considered in connection with the accompanying drawings wherein:

FIG. 1 shows a display driving system including a PLL circuit according to a first embodiment of the present invention.

FIG. 3 is a circuit diagram showing a configuration example of a control-voltage generating circuit according to the first embodiment.

FIG. 4 is a circuit diagram showing a configuration example of a charge pump according to the first embodiment.

FIG. 5 is a circuit diagram showing a configuration example of a low pass filter according to the first embodiment.

DETAILED DESCRIPTION OF THE INVENTION

Figure 2:
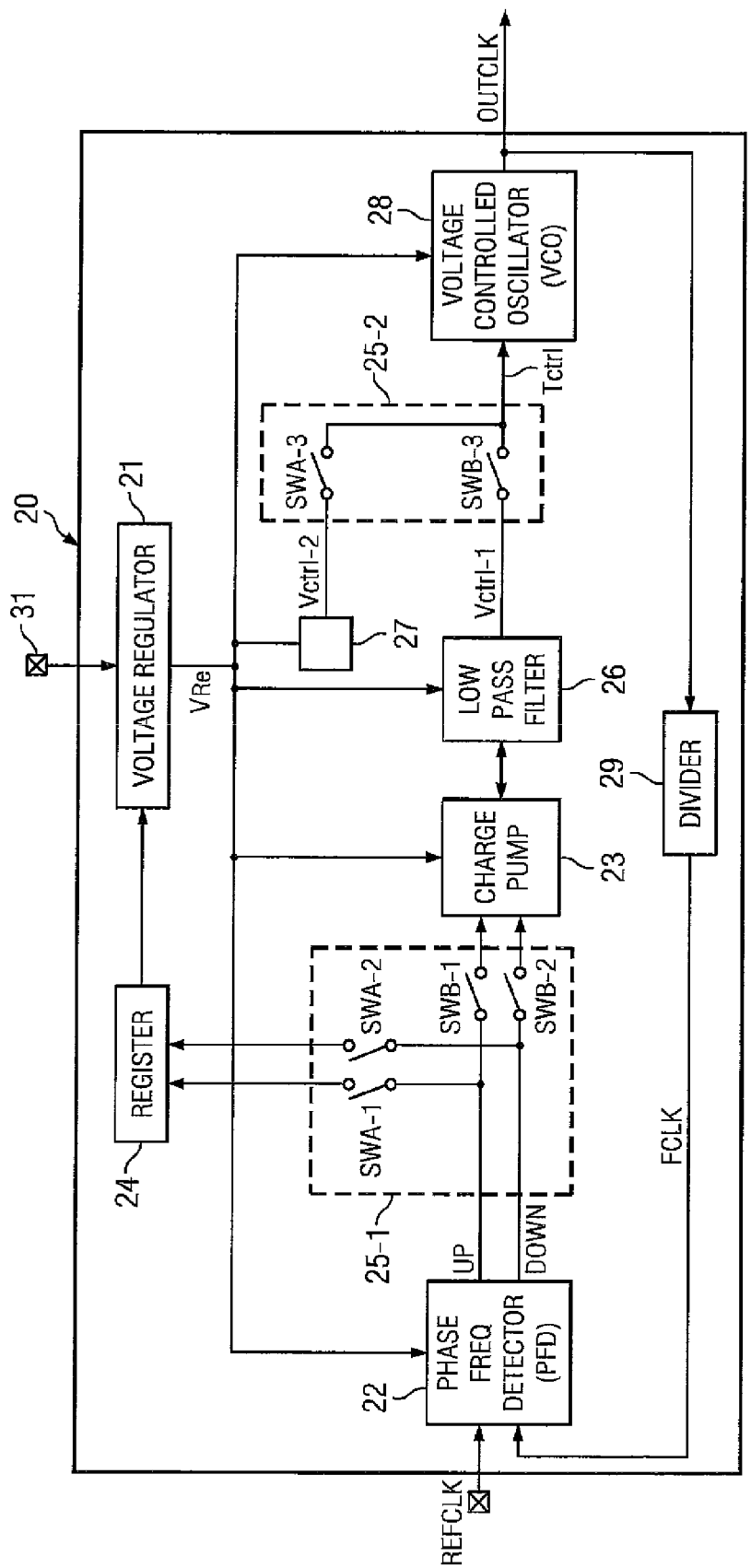
FIG. 2 is a block diagram showing the PLL circuit according to the first embodiment.

Various other objects, features and attendant advantages of the present invention will be more fully appreciated as the same becomes better understood from the following detailed description when considered in connection with the accompanying drawings in which like reference characters designate like or corresponding parts throughout the several views and more particularly to FIG. 1 thereof.

FIRST EMBODIMENT

<1. Example of System Including PLL Circuit (Display Driving System)>

First, FIG. 1 is used to describe an example of a system including a PLL circuit according to a first embodiment of the present invention. A display driving system is here taken as an example of the system including the PLL circuit to be described.

As shown in FIG. 1, a display driving system 10 is used to drive a display 14, and includes a graphic card 12, a CPU, a power-supply detecting chip 16, a slot 15, an ATX power supply 17, and a key board 18.

The graphic card 12 is inserted into the slot 15 of a mother board 11 for use, and outputs a predetermined graphic signal to the display 14 through a cable 13. The graphic card 12 includes a power-supply detecting circuit 19, a PLL circuit 20, and an MPU.

The power-supply detecting circuit 19 detects the power-supply voltage to be supplied to the PLL circuit 20, and inform the PLL circuit of the power-supply voltage. The PLL circuit 20 outputs a generated high-speed clock which is a signal having an integral multiple of the frequency of an input signal to, for example, the MPU as an output clock OUTCLK. The MPU controls operations of the entire graphic card 12.

The display 14 is formed to display an image in accordance with the graphic signal outputted from the graphic card 12.

The power-supply detecting chip 16 is mounted on the mother board 11, and informs the graphic card 12 that the power is supplied from the ATX power supply 17.

The CPU is formed to control the entire display driving system 10.

The key board 18 is operated by an outside user thereby to control the CPU.

The operating frequency range of the PLL circuit 20 needs to be changed because the frequency of a reference clock to be inputted to the PLL circuit 20 is changed when the power is supplied from the ATX power supply 17. At this time, the operating frequency range of the PLL circuit 20 is changed by a mode signal outputted from the CPU or the power-supply detecting chip 16 to the PLL circuit 20. The path through which the power is supplied is shown as, for example, paths L1, L2 and L3 described below.

Through the path L1, the power-supply detecting chip 16 directly outputs the mode signal to the PLL circuit 20. Through the path L2, the mode signal is outputted from the power-supply detecting chip 16 via the CPU and the power-supply detecting circuit 19 to the PLL circuit 20. Through the path L3, the mode signal is outputted from the CPU via the power-supply detecting circuit 19 to the PLL circuit 20.

The operating frequency range of the PLL circuit 20 also needs to be changed because the frequency of the reference clock inputted to the PLL circuit 20 is changed in a predetermined test mode. The predetermined test mode is used when a user wants to change, for example, the resolution and refresh rate of the display 14 after the power is supplied.

At this time, the operating frequency range of the PLL circuit 20 is changed by the mode signal outputted from the key board 18 to the PLL circuit 20. The path at this time is shown as, for example, a path L4 described below. The path L4 is specified by an outside user through the key board 18, and through the path L4, the mode signal is outputted from the key board 18 to the PLL circuit 20.

<2. PLL Circuit>

Next, a configuration example of the PLL circuit 20 will be described by using FIG. 2.

As shown in FIG. 2, the PLL circuit 20 includes a voltage regulator (power-supply voltage controlling section) 21, a phase frequency detector (PFD) 22, a charge pump 23, a register 24, first and second path setting sections 25-1 and 25-2, a low pass filter 26, a control-voltage generating circuit 27, a voltage controlled oscillator (VCO) 28, and a divider 29. The entire PLL circuit 20 according to the present embodiment is driven by a voltage VRe regulated by the regulator (voltage regulator) 21.

With this configuration, the PLL circuit 20 is subjected to a negative feedback, so that the externally inputted reference clock REFCLK and a feedback clock FCLK have the identical frequencies and phases. As a result, the PLL circuit 20 stably operates with an oscillation frequency of an output clock OUTCLK from the VCO 28 being approximately 1.5 GHz which is ten times higher than the frequency of the external reference clock REFCLK.

The regulator (power-supply voltage controlling section) 21 outputs the voltage VRe formed by regulating an external power-supply voltage inputted from an external power supply 31 to a predetermined voltage. In the present embodiment, the regulated voltage VRe generates a voltage lower than the external power-supply voltage supplied from the external power supply 31. The regulator 21 is designed such that the change in the regulated voltage VRe is decreased even when the external power-supply voltage from the external power-supply 31 is changed. In the present embodiment, a case where the external power-supply voltage and the regulated voltage VRe are approximately 2.5 V and approximately 1.6 V, respectively, will be described as an example. Accordingly, in the present embodiment, the PLL circuit 20 is operated not by the external power-supply voltage (2.5 V) but by the regulated voltage VRe (1.6 V).

The PFD 22 outputs a clock resulted from the comparison of the phases and frequencies between the externally inputted reference clock REFCLK and the feedback clock FCLK, to the first path setting section 25-1. In this moment, an UP signal is outputted to the first path setting section 25-1 when the frequency of the feedback clock FCLK is lower than that of the reference clock REFCLK. Meanwhile, a DOWN signal is outputted to the first path setting section 25-1 when the frequency of the feedback clock FCLK is higher than that of the reference clock REFCLK.

In the present embodiment, a case where the reference clock REFCLK and the output clock OUTCLK are at 150 MHz and 1.5 GHz, respectively, will be described as an example.

The divider 29 outputs, to the PFD 22, the feedback clock FCLK obtained by dividing the frequency of the output clock OUTCLK outputted from the VCO 28 into a predetermined frequency. The multiplication number (ratio of frequencies between the reference clock REFCLK and the output clock OUTCLK) of the PLL circuit 20 of the present embodiment is ten. In this case, the divider 29 returns, to the PFD 22, the feedback clock having a frequency decreased to one-tenth of that of the output clock OUTCLK.

The input of the charge pump 23 is connected to the first path setting section 25-1, and the charge pump 23 outputs an electric charge in accordance with the output from the PFD 22. For example, the charge pump 23 injects the electric charge into the low pass filter 26 when receiving the UP signal from the PFD 22, and pulls out the electric charge from the low pass filter 26 when receiving the DOWN signal from the PFD 22.

The input of the register 24 is connected to the first path setting section 25-1, and the register 24 outputs a predetermined control signal to the regulator 21 thereby to control the output voltage VRe of the regulator 21. The register 24 is provided with a certain initial value. This makes the output voltage VRe of the regulator 21 a certain initial voltage, for example, approximately 1.6 V in the present embodiment.

The first path setting section 25-1 switches the output destination of the PFD 22 from the charge pump 23 to the register 24 when the power is supplied or in the predetermined test mode. The first path setting section 25-1 includes switches SWA-1, SWA-2, SWB-1, and SWB-2.

The input of the switch SWA-1 is connected to the UP signal of the PFD 22, and the output thereof is connected to the input of the register 24. The input of the switch SWA-2 is connected to the DOWN signal of the PFD 22, and the output thereof is connected to the input of the register 24. The input of the switch SWB-1 is connected to the UP signal of the PFD 22, and the output thereof is connected to the input of the charge pump 23. The input of the switch SWB-2 is connected to the DOWN signal of the PFD 22, and the output thereof is connected to the input of the charge pump 23.

The low pass filter 26 stores the electric charge injected from the charge pump 23 then to output a smoothed first control voltage Vctrl-1. Accordingly, the output voltage of the first control voltage Vctrl-1 is increased, when a larger amount of electric charges is injected. The output voltage of the first control voltage Vctrl-1 is decreased, when a larger amount of electric charges is pulled out. The low pass filter 26 is a smoothing circuit consisting of a huge capacitor and resistors as described below.

The input of the control-voltage generating circuit 27, which is connected to the output of the regulator 21, and the control-voltage generating circuit 27 outputs a second control voltage Vctrl-2.

The VCO 28 is driven by the output voltage VRe from the regulator 21, and outputs the output clock OUTCLK having a frequency in accordance with the first and second control voltages Vctrl-1 and Vctrl-2 as well as the regulated voltage VRe, which are applied to a control terminal T ctrl. Accordingly, the increases in the first and second control voltages Vctrl-1 and Vctrl-2 as well as the regulated voltage VRe cause the oscillation frequency of the output clock OUTCLK to be increased. The decreases in the first and second control voltages Vctrl-1 and Vctrl-2 as well as the regulated voltage VRe cause the oscillation frequency of the output clock OUTCLK to be decreased.

The second path setting section 25-2 switches the control voltage inputted to the control terminal T ctrl of the VCO 28 from the first control voltage Vctrl-1 to the second control voltage Vctrl-2 when the power is supplied or in the determined test mode.

Note that the regulator 21 does not need to be mounted in the same chip in which the VCO 28 and the like are mounted. The regulator 21 only needs to be mounted, for example, at least on the same substrate on which the VCO 28 and the like are mounted. Additionally, the register 24 is not limited to the described register as long as the register can control the regulated voltage VRe of the regulator 21.

<3. Configuration Examples>

Next, examples of the circuit constituting the PLL circuit 20 will be described by using FIGS. 3 to 6.

<Configuration Example of Control-Voltage Generating Circuit 27>

FIG. 3 shows a configuration example of the control-voltage generating circuit 27. As shown in FIG. 3, the control-voltage generating circuit 27 includes resistors R1 and R2.

The regulated voltage VRe is applied to one end of the resistor R1, and the other end is connected to the input of the second path setting section 25-2. One end of the resistor R2 is connected to the input of the second path setting section 25-2, and the other end is connected to a ground power supply GND. In the present embodiment, the resistances of the resistors R1 and R2 are approximately equal to each other (resistance value: R1, R2). As a result, the voltage value of the second control voltage Vctrl-2 is approximately a half of that of the regulated voltage VRe.

<Configuration Example of Charge Pump 23>

FIG. 4 shows a configuration example of the charge pump 23. The charge pump 23 includes current sources I1 and I2, and switches SWC-1 and SWC-2.

The input of the current source I1 is connected to the regulated voltage VRe, and the output thereof is connected to one end of the switch SWC-1. The other end of the switch SWC-1 is connected to the input of the charge pump 23. The switch SWC-1 is selected by an UP signal sent from the first path setting section 25-1.

One end of the switch SWC-2 is connected to the input of the charge pump 23, and the other end thereof is connected to the input of the current source I2. The switch SWC-2 is selected by a DOWN signal sent from the first path setting section 25-1. The output of the current source I2 is connected to the ground power supply GND.

<Configuration Example of Low Pass Filter 26>

FIG. 5 shows a configuration example of the low pass filter 26. The low pass filter 26 includes resistors R4 and R5, and a capacitor C0.

One end of the resistor R4 is connected to the output of the charge pump 23, and the other end thereof is connected to the input of the second path setting section 25-2. One end of the resistor R5 is connected to the input of the second path setting side 25-2, and the other end thereof is connected to one electrode of the capacitor C0. The electrode on the other end of the capacitor C0 is connected to the ground power supply GND.

<Configuration Example of Path Setting Section>

Figure 6:
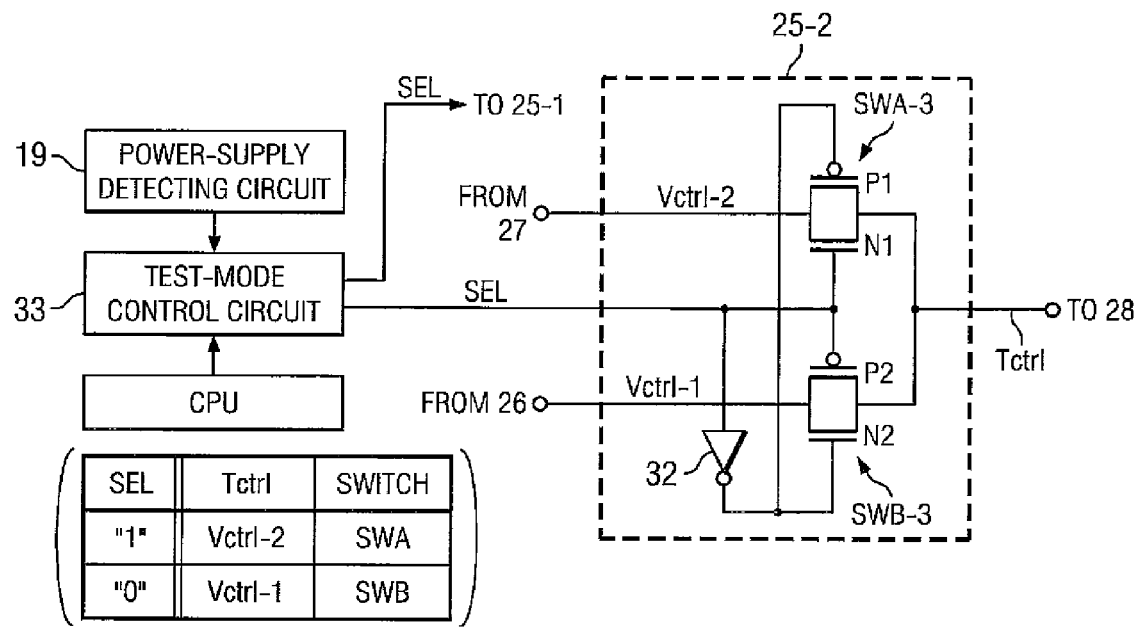
FIG. 6 is a circuit diagram showing a second path setting section according to the first embodiment.

FIG. 6 shows a configuration example of the second path setting section 25-2. As shown in FIG. 6, the second path setting section 25-2 includes MOS transistors P1 and N1 serving as a switch SWA-3, MOS transistors P2 and N2 serving as a switch SWB-3, and an inverter 32.

The gate of the PMOS transistor P1 is connected to the output of the inverter 32. One end of the current path thereof is connected to one end of the current path of the NMOS transistor N1, and the other end of the current path thereof is connected to the other end of the current path of the NMOS transistor N1. The gate of the NMOS transistor N1 is connected to the input of the inverter 32.

The gate of the PMOS transistor P2 is connected to the input of the inverter 32. One end of the current path thereof is connected to one end of the current path of the NMOS transistor N2, and the other end of the current path thereof is connected to the other end of the current path of the NMOS transistor N2. The gate of the NMOS transistor N2 is connected to the output of the inverter 32.

The ON/OFF control of the switches SWA-3 and SWB-3 is carried out by a selection signal SEL outputted from a test-mode control circuit 33. The test-mode control circuit 33 follows the control of the CPU and the power-supply detecting circuit 19 which are mounted on the mother board 11.

For example, when the selection signal SEL is "1", the switch SWA-3 is turned on, and the switch SWB-3 is turned off. Accordingly, the second path setting section 25-2 applies the second control voltage Vctrl-2 to the control terminal T ctrl. On the other hand, when the selection signal SEL is "0", the switch SWA-3 is turned off, and the switch SWB-3 is turned on. Accordingly, the second path setting section 25-2 applies the first control voltage Vctrl-1 to the control terminal T ctrl.

The test-mode control circuit 33 outputs the same selection signal SEL as the above to the switches SWA-1, SWA-2, SWB-1 and SWB-2 of the first path setting section 25-1 to carry out the same control. A configuration example of the first path setting section 25-1 is the same as that of the second path setting section 25-2 shown in FIG. 3.

<4. Operations>

Figure 7:
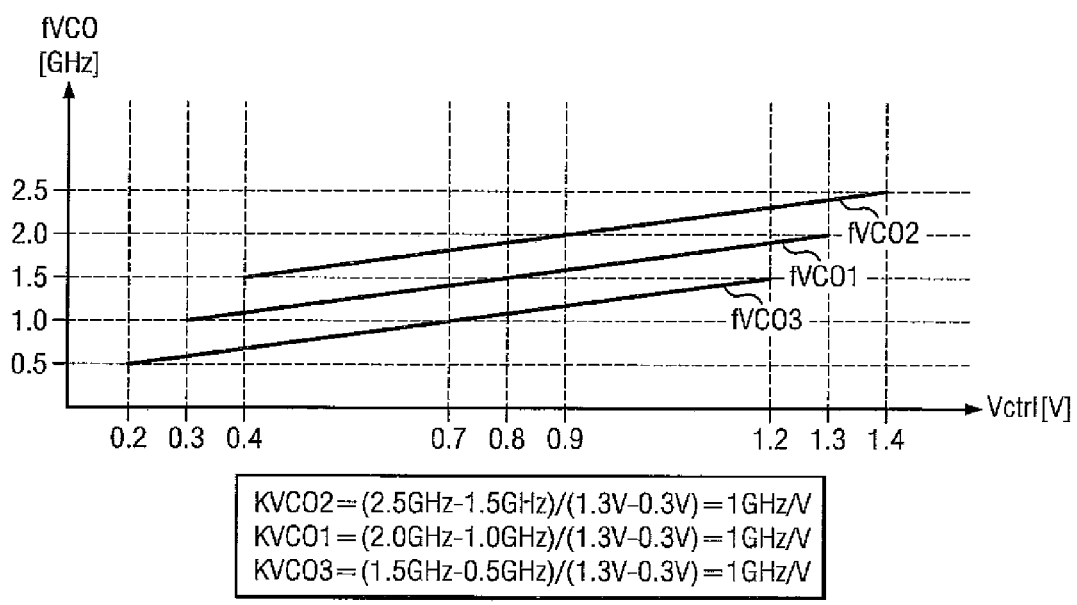
FIG. 7 shows the relationship between a control voltage and an oscillation frequency according to the first embodiment.

Next, operations of the PLL circuit 20 according to the present embodiment will be described. The description is made using a characteristic line in FIG. 7. FIG. 7 shows the relationship between the control voltage Vctrl and the oscillation frequency of the output clock OUTCLK.

<4-0. Normal Test Mode>

A normal test mode will first be described. This test mode corresponds to a characteristic line fVCO1 in the drawing. A case where the frequency of the external reference clock REFCLK is 150 MHz and the output voltage VRe of the regulator 21 is 1.6 V will be described as an example here.

In the normal test mode, the switches SWA-1, SWA-2 and SWA-3 in the first and second path setting sections 25-1 and 25-2 are turned off, and the switches SWB-1, SWB-2 and SWB-3 in the first and second path setting sections 25-1 and 25-2 are turned on.

The continuation of the above state allows this feedback loop to stably operate with a frequency of output clock OUTCLK from the VCO 28 of 1.5 GHz and with a first control voltage Vctrl-1 of 0.8 V.

When the feedback loop is stabilized, the value of the register 24 corresponding to the stabilization point is subsequently fixed. As a result, the output clock OUTCLK of the PLL circuit 20 acts in the manner shown by the characteristic line fVCO1.

<4-1. When Power is Supplied or in Predetermined Test Mode (when REFCLK is Increased)>

Next, operations carried out in the case where the frequency of the reference clock REFCLK is increased, when the power is supplied or in the predetermined test mode, will be described. When the power is supplied or in the predetermined test mode, the frequency of the reference clock REFCLK is increased in some cases as compared to that in the above normal test mode. The characteristic line in this case corresponds to a characteristic line fVCO2 in the drawing.

For example, when the power is supplied, by activating the ATX power supply 17, the voltage value of the external power supply 31 is increased through the paths L1 to L3, and the frequency of the reference clock REFCLK is increased in some cases. In the predetermined test mode, the frequency of the reference clock REFCLK is also increased in some cases through the path L4 used in operating the key board 18, for example, to change the initial setting of the display 14.

In the present embodiment, the case where the reference clock REFCLK having a frequency increased from 150 MHz in the normal test mode to 200 MHz is inputted to the PLL circuit 20 will be exemplified.

The test-mode control circuit 33 first transmits the selection signal SEL of "1" to the first and second path setting sections 25-1 and 25-2. Then, the switches SWA-1, SWA-2 and SWA-3 in the first path setting section 25-1 are turned on. The switches SWB-1, SWB-2 and SWB-3 in the second path setting section 25-2 are turned off.

At this time, the output voltage VRe of approximately 1.6 V is outputted as an initial value from the regulator 21. Accordingly, the second control voltage Vctrl-2 of approximately 0.8 V is applied to the control terminal T ctrl of the VCO 28. As a result, the output clock OUTCLK of approximately 1.5 GHz is outputted from the VCO 28.

Subsequently, the feedback clock FCLK having a frequency of 150 MHz obtained by dividing the frequency of the output clock OUTCLK to one-tenth is inputted to the PFD 22.

Thereafter, the PFD 22 outputs the UP signal because the frequency of the feedback clock FCLK thus inputted is lower than that of the external reference clock REFCLK.

After that, the register 24 increments the value of the register by one because the UP signal is inputted. Then, the register 24 outputs the control signal so that the output voltage VRe of the regulator 21 is somewhat increased.

Subsequently, the driving voltage VRe of the VCO 28 is somewhat increased. Consequently, the frequency of the output clock OUTCLK of the VCO 28 is somewhat increased. This operation is thereafter repeated until the external reference clock REFCLK and the feedback clock FCLK have the identical frequencies and phases.

After the external reference clock REFCLK and the feedback clock FCLK have the identical frequencies and phases, in the present embodiment, it is assumed that the output voltage VRe of the regulator 21 and the second control voltage Vctrl-2 are approximately 1.8 V and a half thereof, that is, approximately 0.9 V, respectively.

In this case, when the feedback loop is stabilized, the register value of the register 24 is fixed. The test-mode control circuit 33 transmits the selection signal SEL of "0" to the first and the second path setting sections 25-1 and 25-2. Then, the switches SWA-1, SWA-2 and SWA-3 in the first path setting section 25-1 are returned to OFF. The switches SWB-1, SWB-2 and SWB-3 in the second path setting section 25-2 are returned to ON.

As a result, the output clock OUTCLK of the PLL circuit 20 acts in the manner shown by the characteristic line fVCO2.

<4-2. When Power is Supplied or in Predetermined Test Mode (when REFCLK is Decreased)>

Next, operations carried out in the case where the frequency of the reference clock REFCLK is decreased, when the power is supplied or in the predetermined test mode, will be described. When the power is supplied or in the predetermined test mode, the frequency of the reference clock REFCLK is decreased in some cases as compared to that in the above normal test mode. The characteristic line in this case corresponds to a characteristic line fVCO3 in the drawing.

For example, when the power is supplied, by activating the ATX power supply 17, the voltage value of the external power supply 31 is decreased through the paths L1 to L3, and the frequency of the reference clock REFCLK is decreased in some cases. In addition, in the predetermined test mode, the frequency of the reference clock REFCLK is also decreased in some cases through the path L4 used in operating the key board 18, for example, to change the initial setting of the display 14.

In the present embodiment, the case where the reference clock REFCLK having a frequency decreased from 150 MHz in the normal test mode to 100 MHz is inputted to the PLL circuit 20 will be exemplified.

The test-mode control circuit 33 first transmits the selection signal SEL of "1" to the first and second path setting sections 25-1 and 25-2. Then, the switches SWA-1, SWA-2 and SWA-3 in the first path setting section 25-1 are turned on. The switches SWB-1, SWB-2, and SWB-3 in the second path setting section 25-2 are turned off.

At this time, the output voltage VRe of approximately 1.6 V is outputted as an initial value from the regulator 21. Accordingly, the second control voltage Vctrl-2 of approximately 0.8 V is applied to the control terminal T ctrl of the VCO 28. As a result, the output clock OUTCLK of approximately 1.5 GHz is outputted from the VCO 28.

Subsequently, the feedback clock FCLK having a frequency of 150 MHz obtained by dividing the frequency of the output clock OUTCLK to one-tenth is inputted to the PFD 22.

Thereafter, the PFD 22 outputs the DOWN signal because the frequency of the feedback clock FCLK thus inputted is higher than that of the external reference clock REFCLK.

After that, the register 24 decrements the value of the register by one because the DOWN signal is inputted. Then, the register 24 outputs the control signal so that the output voltage VRe of the regulator 21 is somewhat decreased.

Subsequently, the driving voltage VRe of the VCO 28 is somewhat decreased. Consequently, the frequency of the output clock OUTCLK of the VCO 28 is somewhat decreased. This operation is thereafter repeated until the external reference clock REFCLK and the feedback clock FCLK have the identical frequencies and phases.

After the external reference clock REFCLK and the feedback clock FCLK thereafter have the identical frequencies and phases, in the present embodiment, it is assumed that the output voltage VRe of the regulator 21 and the second control voltage Vctrl-2 are approximately 1.4 V and a half thereof, that is, approximately 0.7 V, respectively.

In this case, when the feedback loop is stabilized, the register value of the register 24 is fixed. The test-mode control circuit 33 transmits the selection signal SEL of "0" to the first and the second path setting sections 25-1 and 25-2. Then, the switches SWA-1, SWA-2 and SWA-3 in the first path setting section 25-1 are returned to OFF. The switches SWB-1, SWB-2 and SWB-3 in the second path setting section 25-2 are returned to ON.

As a result, the output clock OUTCLK of the PLL circuit 20 acts in the manner shown by the characteristic line fVCO3.

<5. Effects of Present Embodiment>

The PLL circuit according to the present embodiment provides effects at least described in the following (1) and (2).

(1) The oscillation frequency range can be expanded while the jitter is kept low.

As described above, when the power is supplied or in the predetermined test mode <4-1.> or <4-2.>, the frequency of the reference clock REFCLK is changed to be increased or decreased as compared to that in the normal test mode <4-0.>.

Accordingly, when the power is supplied or in the predetermined test mode <4-1.> or <4-2.>, the test-mode control circuit 33 transmits the selection signal SEL of "1" to the first and second path setting sections 25-1 and 25-2. Thereby, the switches SWA-1, SWA-2 and SWA-3 in the first path setting section 25-1 are turned ON. The switches SWB-1, SWB-2 and SWB-3 in the second path setting section 25-2 are turned OFF.

In this manner, when the power is supplied or in the predetermined test mode, the feedback loop (the switches SWB-1, SWB-2 and SWB-3), which serves to increase or decrease the control voltage Vctrl of the VCO 28, is cut off. On the other hand, the feedback loop (the switches SWA-1, SWA-2 and SWA-3), which serves to increase or decrease the output voltage VRe of the regulator, is formed.

Accordingly, the second control voltage Vctrl-2 obtained by dividing the regulated voltage VRe is applied to the control terminal T ctrl of the VCO 28. Consequently, the value of the gradients KVCO1 to KVCO3 shown in FIG. 7 can be kept low. Since the values of the gradients KVCO1 to KVCO3 can be kept low, the jitter can be kept low.

Furthermore, when the power is supplied or in the predetermined test mode, the register 24 controls the regulator 21 such that the regulated voltage VRe corresponding to the increase or decrease in the reference clock REFCLK is inputted into the regulator 21 as the driving voltage of the VCO 28.

As a result, the optimum control voltage Vctrl-2 and optimum regulated voltage VRe corresponding to the increase or decrease in the oscillation frequency band can be supplied to the VCO 28. Thereby, the oscillation frequency range can be expanded while the jitter is kept low.

For example, as shown by the characteristic lines fVCO1 to fVCO3 in FIG. 7, the PLL circuit 20 according to the present embodiment can expand the oscillation frequency range of 0.5 GHz to 2.5 GHz while maintaining the KVCO1 to KVCO3. This shows that the present embodiment allows the oscillation frequency range to be further expanded as compared to the oscillation frequency range of a PLL circuit 120, which is from 1.0 GHz to 2 GHz, according to a comparative example described below.

(2) The usable range of the regulated voltage VRe can be expanded, resulting in an expanded oscillation frequency range (operating frequency range) of the VCO 28.

This is because the optimum regulated voltage VRe can be obtained for every chip even when the characteristic of the regulator 21 on every chip varies due to the production process. In other words, this is because the register 24 controls the regulator 21 such that the regulator 21 outputs the regulated voltage VRe which causes the VCO 28 to output a clock having a predetermined frequency, when the second control voltage Vctrl-2 obtained by dividing the regulated voltage VRe (in the present embodiment, ½×the regulated voltage VRe) is applied to the control terminal T ctrl.

For example, in the present embodiment, as shown by the characteristic line fVCO1 in FIG. 7, every chip can obtain the regulated voltage VRe by which the output clock OUTCLK having a frequency of 1.5 GHz is obtained, when the second control voltage Vctrl-2 is applied to the control terminal T ctrl. Therefore, an output frequency range (operating frequency range) of 1.0 GHz to 2.0 GHz is guaranteed by the PLL circuit 20.

Figure 8:
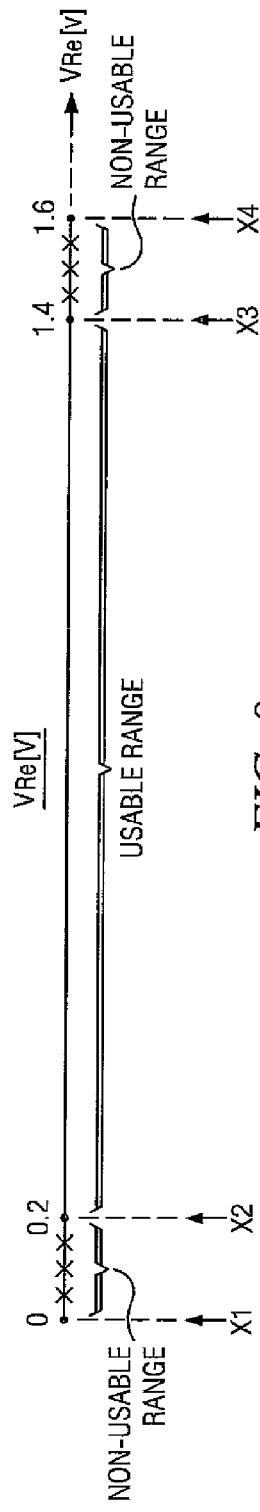
FIG. 8 shows a usable range of an output voltage from a voltage regulator according to the first embodiment.

Accordingly, as shown in FIG. 8, even when the amount of change in the oscillation frequency due to the variation in the production process of the regulator 21 is considered, the usable range of X2 to X3 can be expanded to 0.2 V to 1.4 V as compared to that of, for example, the comparative example described below. In addition, as compared to the comparative example, the other non-usable ranges (X1 to X2 and X3 to X4) can be reduced in ranges of 0 V to 0.2 V and 1.4 V to 1.6 V, respectively.

As described above, the register 24 controls the regulator 21 such that the optimum regulated voltage VRe is obtained for every oscillation frequency. Therefore, the oscillation frequency range (operating frequency range) guaranteed by the PLL circuit 20 can be expanded.

The regulated voltage VRe of the present embodiment is supplied as a driving voltage to not only the VCO 28 but also other elements forming the PLL circuit 20 including the PFD 22, the charge pump 23, and the low pass filter 26. Accordingly, as in the above (1) and (2), the register 24 can control the regulator 21 such that the optimum regulated voltage VRe is obtained for every oscillation frequency even in a case where the frequency of the reference clock REFCLK is changed when the power is supplied or in the predetermined test mode.

As a result, the present embodiment is advantageous in that the driving voltage VRe can be stably supplied to not only the VCO 28 but also the other elements forming the PLL circuit 20 including the PFD 22, the charge pump 23, and the low pass filter 26.

SECOND EMBODIMENT (Another Example of Connection Position of Control-Voltage Generating Circuit)

Next, a semiconductor memory device according to a second embodiment will be described by using FIGS. 9 and 10. This embodiment relates to another example of a connection position of a control-voltage generating circuit. The detailed descriptions of the parts overlapping with those of the first embodiment will be omitted in this description.

Figure 9:
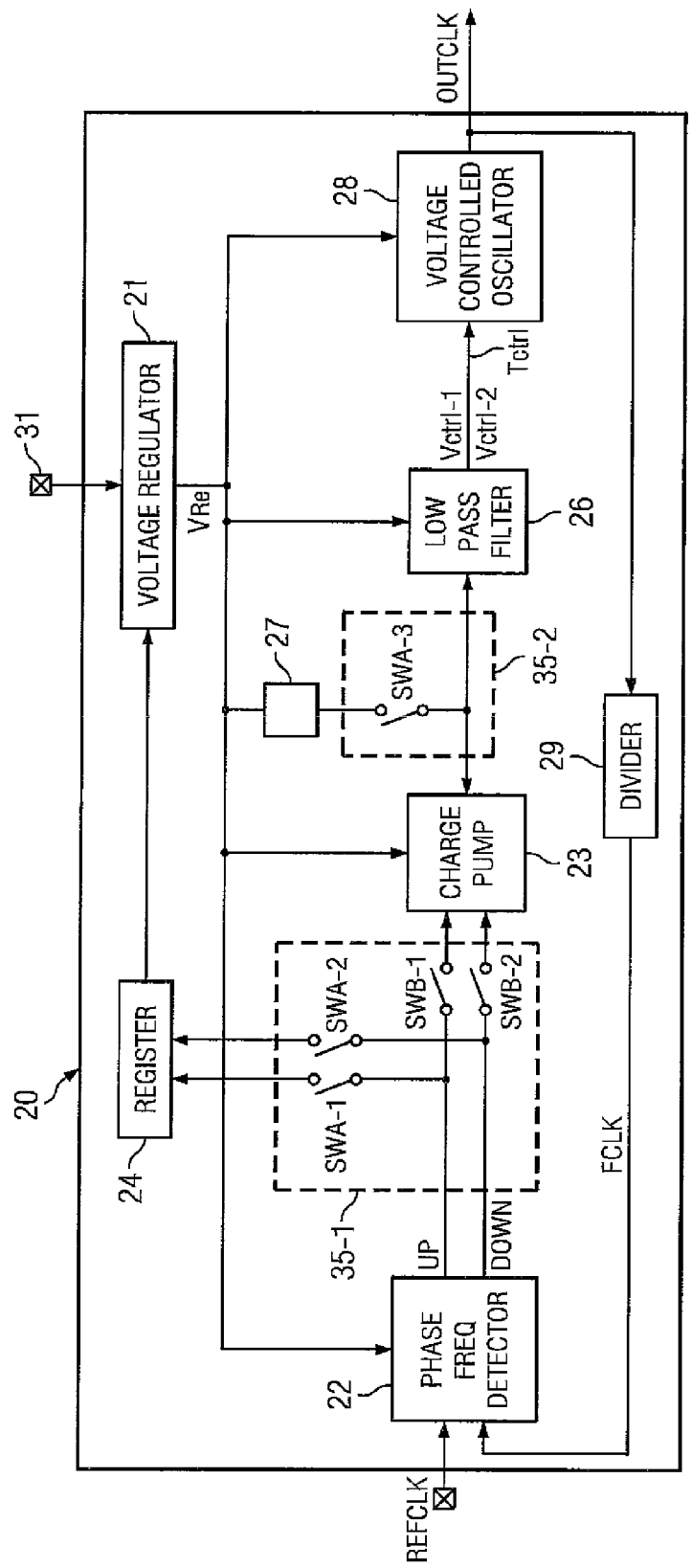
FIG. 9 is a block diagram showing a PLL circuit according to a second embodiment.

As shown in FIG. 9, the PLL circuit 20 of the present embodiment is different from the first embodiment in the following point. Specifically, the output of the control-voltage generating circuit 27 is connected via the second path setting section 35-2 to the input of the low pass filter 26. The second path setting section 35-2 is connected to the input of the low pass filter 26, and differs from the first embodiment in that the second path setting section 35-2 is not provided with the switch SWB-3.

Next, an output waveform of the second control voltage Vctrl-2 of the present embodiment will be described by using FIG. 10.

Figure 10:
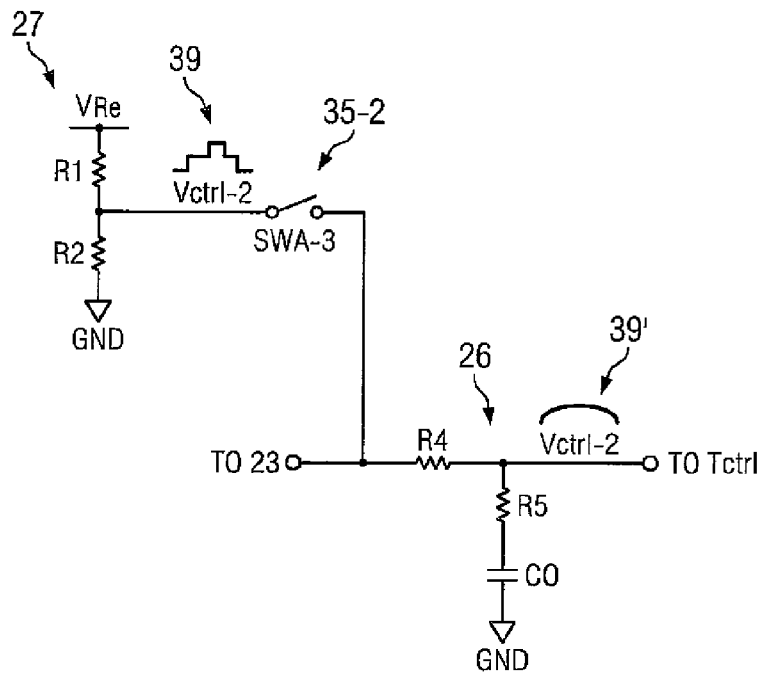
FIG. 10 is a circuit diagram for describing an output waveform of a control voltage according to the second embodiment.

As shown in FIG. 10, the configurations of the control-voltage generating circuit 27, the second path setting section 35-2, and low pass filter 26 are the same as those in the first embodiment. However, the output of the control-voltage generating circuit 27 is connected via the second path setting section 35-2 to the input of the low pass filter 26.

An output waveform 39 of the second control voltage Vctrl-2 which has passed the low pass filter 26 is consequently formed in a smooth shape as compared to the output waveform 39 of the second control voltage Vctrl-2 which has not passed the low pass filter 26.

The operations are the same as those of the first embodiment. Accordingly, the detailed description will be omitted.

As described above, the PLL circuit of the present embodiment provides at least the same effects as the above (1) and (2).

Furthermore, the output of the control-voltage generating circuit 27 according to the present embodiment is connected via the second path setting section 35-2 to the input of the low pass filter 26.

The output waveform 39 of the second control voltage Vctrl-2 which has passed the low pass filter 26 can consequently be formed in a smooth shape as compared to the waveform 39 of the second control voltage Vctrl-2 which has not passed the low pass filter 26.

As a result, the present embodiment is advantageous in that the reliability of the second control voltage Vctrl-2 inputted to the VCO 28 can further be increased even when the power is supplied or in the predetermined test mode as described in the above <4-1.> and <4-2.>.

THIRD EMBODIMENT (Example in which Differential-Voltage Controlled Oscillator (Differential VCO) is Employed)

Next, a semiconductor memory device according to a third embodiment will be described by using FIG. 11. This embodiment relates to an example in which the above VCO 28 is employed as a differential-VCO. The detailed descriptions of the parts overlapping with those of the first embodiment will be omitted in this description.

As illustrated, in the first and second embodiments, the case where a single-end VCO having the single control terminal T ctrl (single-end VCO) is employed as the VCO 28 has been exemplified for the descriptions. The present embodiment is an example of a case where a differential-VCO 58 driven in accordance with the difference in voltages between two control terminals is employed as a VCO.

Figure 11:
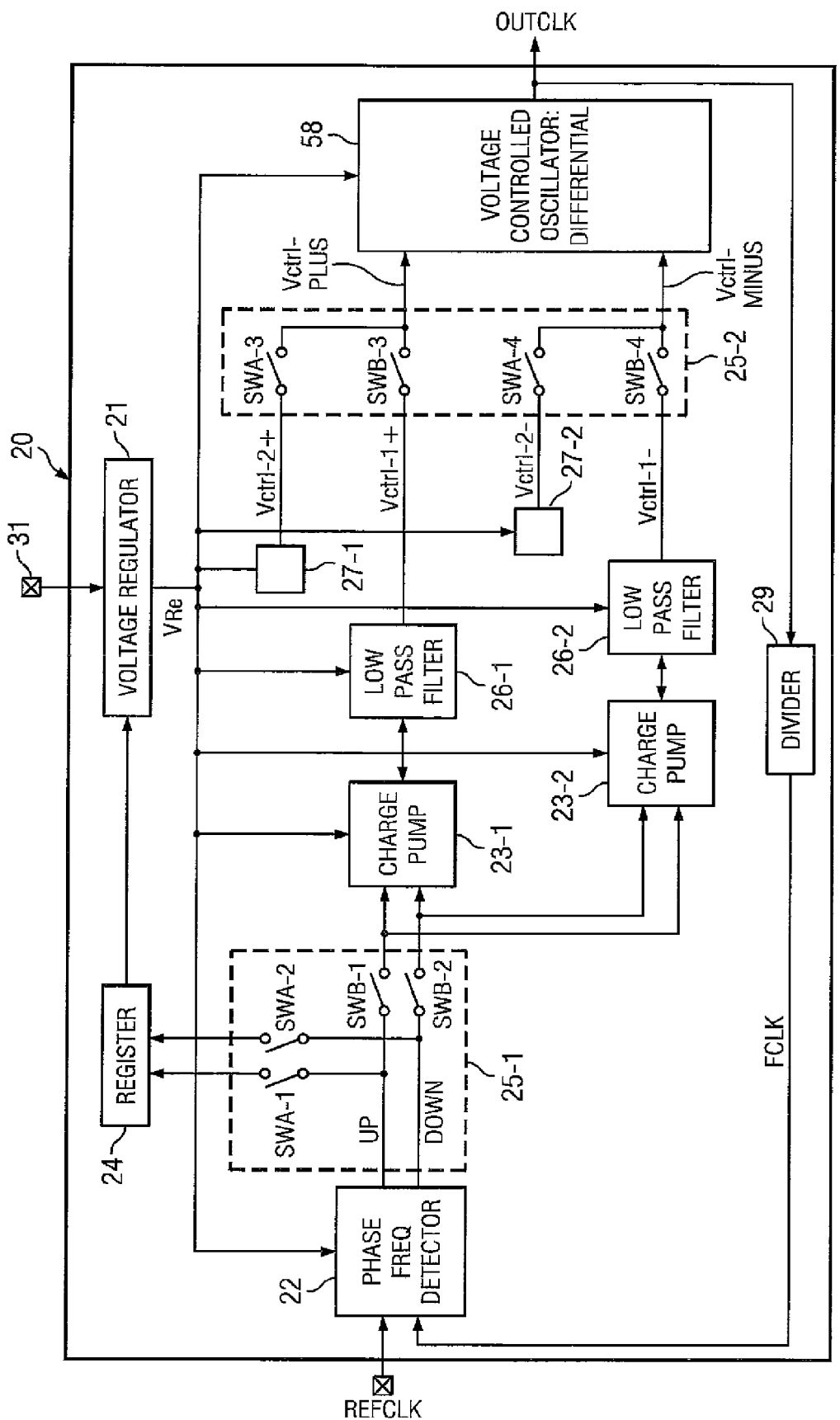
FIG. 11 is a block diagram showing a PLL circuit according to a third embodiment.

As shown in FIG. 11, the PLL circuit 20 according to the present embodiment is different from that of the first embodiment in that the PLL circuit 20 includes the differential-VCO 58 as well as a charge pump 23-2, a low pass filter 26-2 and a control-voltage generating circuit 27-2.

The input of the charge pump 23-2 is connected to the first path setting section 25-1, and the output thereof is connected to the low pass filter 26-2.

The output of the low pass filter 26-2 is connected to one end of the switch SWB-4 of the second path setting section 25-2.

The output of the control-voltage generating circuit 27-2 is connected to one end of the switch SWA-4 of the second path setting section 25-2.

The other ends of the switches SWA-4 and SWB-4 are connected to the negative control terminal of the differential-VCO 58.

Any one of a control voltage Vctrl-$2^+$ outputted from the control-voltage generating circuit 27-1 and a control voltage Vctrl-$1^+$ outputted from the low pass filter 26-1 is inputted as a control voltage Vctrl_plus to the positive control terminal of the differential-VCO 58, while being switched to each other in accordance with the above test mode. Any one of a control voltage Vctrl-$2^-$ outputted from the control-voltage generating circuit 27-2 and a control voltage Vctrl-$1^-$ outputted from the low pass filter 26-2 is inputted as a control voltage Vctrl_minus to the negative control terminal of the differential-VCO 58, which being switched to each other in accordance with the above test mode.

Figure 12:
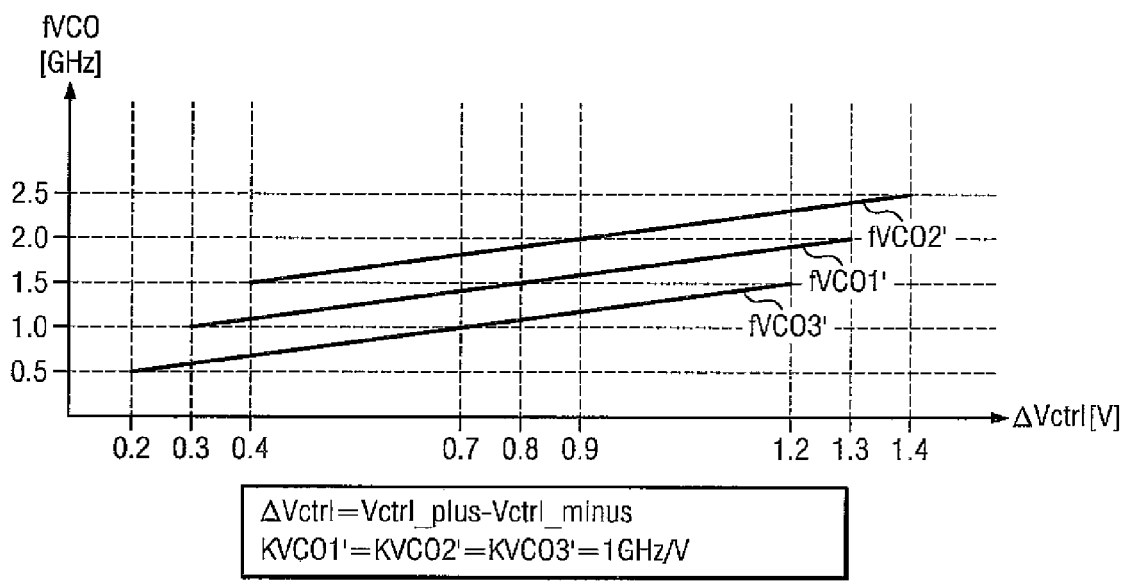
FIG. 12 shows the relationship between a control voltage and an oscillation frequency according to the third embodiment.

A characteristic line representing the relationship between a control voltage ΔVctrl and an oscillation frequency of the PLL circuit 20 according to the present embodiment is shown as in FIG. 12. In this drawing, the control voltage ΔVctrl is a difference between the control voltage Vctrl_plus and the control voltage Vctrl_minus (ΔVctrl=Vctrl_plus-Vctrl_minus).

Thus, any of gradients KVCO1' to KVCO3' of characteristic lines fVCO1' to fVCO3' in the drawing is identical to each other, and the value of each gradient is approximately 1 GHz/V (gradients:

KVCO1'=KVCO2'=KVCO3'=1 GHz/V).

The other operations and the like are the same as those of the first embodiment. Accordingly, the detailed descriptions will be omitted.

As described above, the PLL circuit according to the present embodiment provides at least the same effects as the above (1) and (2).

Furthermore, according to the present embodiment, the differential-VCO 58 driven in accordance with the difference in the control terminals is provided as a VCO. The PLL circuit 20 according to the present embodiment is different from that of the first embodiment in that the PLL circuit 20 additionally includes the charge pump 23-2, the low pass filter 26-2 and the control-voltage generating circuit 27-2.

Accordingly, the control voltage Vctrl_plus or the control voltage Vctrl_minus is inputted to the positive control terminal or the negative control terminal of the differential-VCO 58. Therefore, even when the control voltage Vctrl_plus and the control voltage Vctrl_minus are changed, the difference, that is, the control voltage ΔVctrl can be maintained. Thereby, the present embodiment is advantageous in that the output frequency of the output clock OUTCLK can be further stabilized even when the control voltage is changed.

Comparative Example

Figure 13:
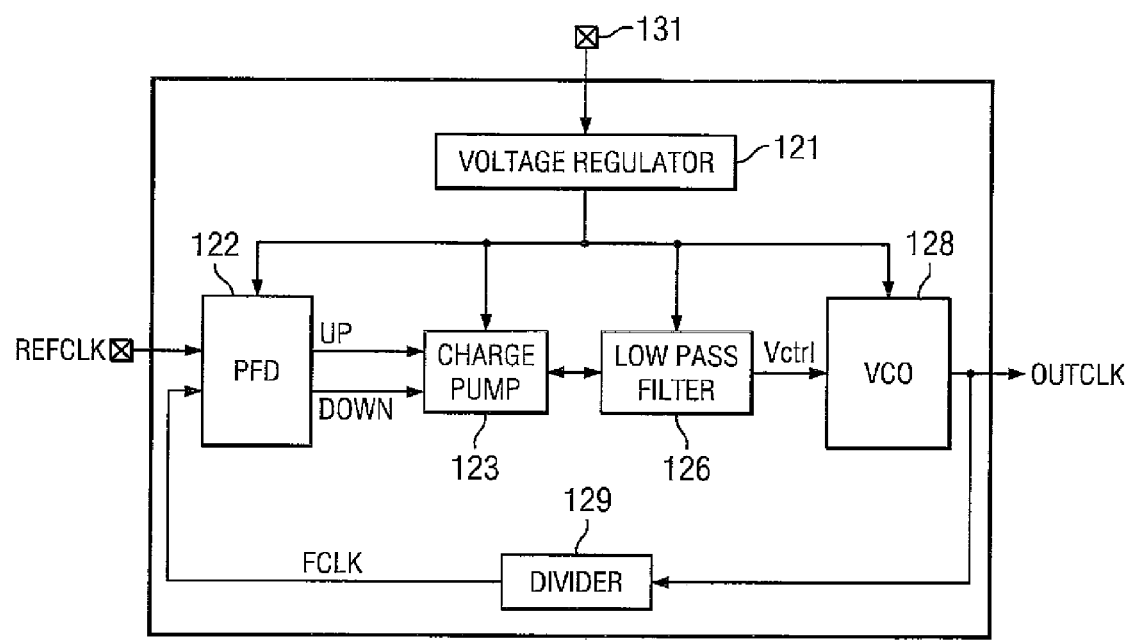
FIG. 13 is a block diagram showing a PLL circuit of a comparative example.

Next, a PLL circuit of the comparative example will be described by using FIGS. 13 to 15 to make comparison with the first to third embodiments. In this description, the detailed descriptions of the parts overlapping with those of the first embodiment will be omitted. FIG. 13 is a block diagram showing a PLL circuit 120 of the comparative example.

Configuration Example

As shown in FIG. 13, the PLL circuit 120 of the comparative example is the same as those of the first to third embodiments in that a driving voltage from a regulator 121 is supplied to any of a PFD 122, a charge pump 123, a low pass filter 126 and a VCO 128. On the other hand, the PLL circuit 120 of the comparative example is different from those of the first to third embodiments in that the PLL circuit 120 is not provided with a register, a control-voltage generating circuit, and a first and second path setting sections.

<Operations>

Next, operations of the PLL circuit 120 of the comparative example will be described by using FIGS. 14 and 15.

Figure 14:
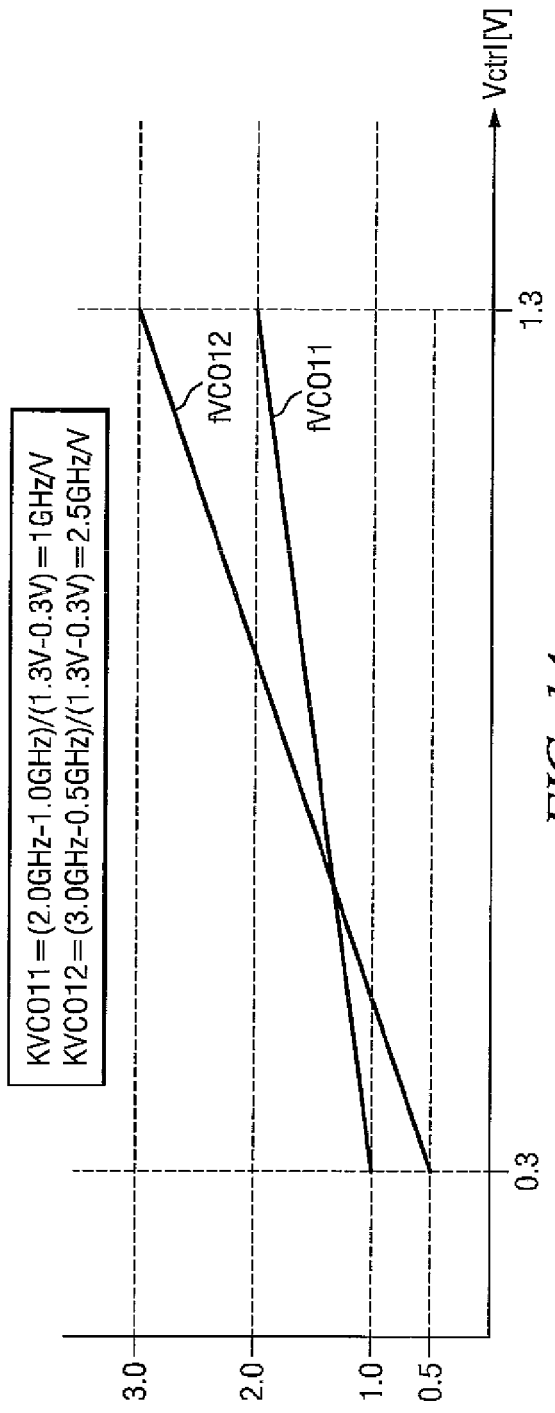
FIG. 14 shows the relationship between a control voltage and an oscillation frequency in the comparative example.
Figure 15:
FIG. 15 shows a usable range of an output voltage from a voltage regulator in the comparative example.

FIG. 14 shows the relationship between the control voltage Vctrl and oscillation frequency of the PLL circuit 120 of the comparative example.

As shown by a characteristic line fVCO11 in FIG. 14, the lower limit of the control voltage Vctrl is 0.3 V, and the oscillation frequency of an output clock OUTCLK of the VCO 128 is 1 GHz corresponding to the lower limit. The upper limit of the control voltage Vctrl is 1.3 V, and the oscillation frequency of the output clock OUTCLK of the VCO 128 is 2 GHz corresponding to the upper limit. The oscillation frequency of the output clock OUTCLK is divided to one-tenth by a divider 129, and outputted to the PFD 122.

Accordingly, the PLL circuit 120 of the comparative example can operate so as to correspond to the external reference clock REFCLK in a range of 100 MHz to 200 MHz. How much the oscillation frequency is changed when the control voltage Vctrl is changed by 1 V is generally called KVCO as described above.

It may here be considered that KVCO11 should be increased (that is, the gradient of the line should be increased) to obtain a line equivalent to a characteristic line fVCO12 shown in the figure thereby to increase the operating frequency range of the PLL circuit 120, theoretically. However, when the KVCO11 is increased, a slight change in the control voltage Vctrl causes the frequency of the output clock OUTCLK from the VCO 128 to be changed.

Accordingly, a jitter is increased because the change in frequency is nothing but the change in phase. Therefore, the KVCO should be as small as possible to reduce the jitter.

As described above, it is seen that the reduction in jitter and the increase in band (to increase the difference between the upper and lower limits of the oscillation frequency) are conflicting requirements.

As described above, the oscillation frequency of the VCO 128 is increased when the power-supply voltage is increased, and decreased when the power-supply voltage is decreased. For this reason, when the output voltage VRe of the regulator (voltage regulator) 121 is changed due to a variation in the production process, the characteristic lines fVCO11 and fVCO12 in FIG. 14 are shifted upward or downward.

Accordingly, as shown in FIG. 14, the guaranteed oscillation frequency range (operating frequency range) is decreased in consideration of the amount of change in the oscillation frequency due to such a variation in the production process. In this comparative example, the usable range of the control voltage VRe from X12 to X13 is 0.3 V to 1.3 V in consideration of the variation in the production process of the regulator 121. The other ranges of 0 V to 0.3 V and 1.3 V to 1.6 V consequently are non-usable.

As described above, the PLL circuit 120 of the comparative example has the following problems.

Firstly, when the KVCO of the VCO 128 is increased to expand the oscillation frequency range (operating frequency range), the jitter is consequently increased. Therefore, the oscillation frequency range cannot be expanded while the jitter is kept low.

Secondly, the output voltage VRe of the regulator (voltage regulator) 121 is changed due to the variation in the production process thereof. In considering the amount of such a change, the guaranteed usable range is decreased. Consequently, the oscillation frequency range (operating frequency range) of the VCO 128 is narrowed.

Hereinabove, the present invention has been described by using the first to third embodiments and the comparative example. The present invention is not limited as illustrated by the embodiments and the comparative example. Various modifications may be made in implementing the invention without departing from the scope and spirit of the invention. The embodiments and the comparative example include various stages of the invention. Appropriate combinations of a plurality of the disclosed constitutions allow various inventions to be extracted. For example, when the elimination of some constituents from all the constituents shown in the embodiments and the comparative example allows at least one of the problems described in the section of Description of the Related Art to be solved, and allows at least one of the effects described in the section of DETAILED DESCRIPTION OF THE INVENTION to be obtained, the configuration from which the constituents are eliminated can be extracted as an invention.

In addition, this invention is not at all limited to the details of the embodiment above described, and this invention can otherwise be practiced within the main point of this invention.

While the invention is subject to various modifications and alternative forms, specific embodiments thereof are shown by way of embodiment in the drawings and the accompanying detailed description. It should be understood that the drawings and detailed description are not intended to limit the invention to the particular embodiments which are described. This disclosure is instead intended to cover all modifications, equivalents and alternatives falling within the scope of the present invention as defined by the appended claims.

What is claimed is:

1. A circuit, comprising:
a voltage regulator configured to provide an output voltage;
a phase frequency detector configured to compare phases and frequencies between a reference clock and a feedback clock, and outputs a clock resulting from the comparison on an output;
a charge pump configured to output an electric charge in accordance with the output from the phase frequency detector;
a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the charge pump in a second mode of operation and switch between the first mode of operation and the second mode of operation;
a low pass filter configured to store the electric charge injected from the charge pump to output a first control voltage on an output;
a control-voltage generating circuit configured to output a second control voltage on an output, wherein the second control voltage is obtained by dividing the output voltage of the voltage regulator;
a voltage controlled oscillator configured to output an output clock;
a second path setting section configured to couple the output of the control-voltage generating circuit to the voltage controlled oscillator in a first mode of operation, couple the output of the low pass filter to the voltage controlled oscillator in a second mode of operation and switch between the first mode of operation and the second mode of operation such that the voltage controlled oscillator produces the output clock in accordance with the second control voltage and the output voltage of the voltage regulator in the first mode of operation and the voltage controlled oscillator produces the output clock in accordance with the first control voltage and the output voltage of the voltage regulator in the second mode of operation; and
a divider configured to output the feedback clock, wherein the feedback clock is obtained by dividing the output clock of the voltage controlled oscillator to the phase frequency detector.

2. The circuit according to claim 1, wherein
the second control voltage is a voltage formed by a resistor divider including a first resistor and a second resistor provided between the output voltage of the voltage regulator and a power-supply voltage, and
the second control voltage is approximately K times the output voltage of the voltage regulator where K is a rational number between 0 and 1.

3. The circuit according to claim 2, wherein a resistance of the first resistor is approximately equal to a resistance of the second resistor.

4. The circuit according to claim 1, further comprising a register, wherein in the first mode of operation the register is coupled to the output of the phase frequency detector, the register outputs a control signal to the voltage regulator in accordance with the output of the phase frequency detector and the output voltage of the voltage regulator is based upon the control signal.

5. The circuit according to claim 1, wherein
the clock output by the phase frequency detector comprises an UP signal when the frequency of the feedback clock is lower than the frequency of the reference clock and a DOWN signal when the frequency of the feedback clock is higher than the frequency of the reference clock, and
in the first mode of operation the output voltage of the voltage regulator increases when the clock output by the phase frequency detector comprises an UP signal and the output voltage of the voltage regulator decreases when the clock output by the phase frequency detector comprises a DOWN signal.

6. A circuit, comprising:
a voltage regulator configured to provide an output voltage;
a phase frequency detector configured to compare phases and frequencies between a reference clock and a feedback clock, and outputs a clock resulting from the comparison on an output;

a charge pump configured to output an electric charge on an output in accordance with the output from the phase frequency detector;

a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the charge pump in a second mode of operation and switch between the first mode of operation and the second mode of operation;

a low pass filter configured to store the electric charge output from the charge pump to output a first control voltage on an output;

a control-voltage generating circuit configured to output a second control voltage on an output, wherein the second control voltage is obtained by dividing the output voltage of the voltage regulator;

a voltage controlled oscillator configured to output an output clock;

a second path setting section configured to couple the output of the control-voltage generating circuit to the low pass filter in the first mode of operation, de-couple the output of the control-voltage generating circuit from the low pass filter in the second mode of operation and switch between the first mode of operation and the second mode of operation such that the output of the voltage controlled oscillator is based on the output of the charge pump and the second control voltage in the first mode of operation and on the output of the charge pump in the second mode of operation.

7. The circuit according to claim 6, wherein
the second control voltage is a voltage formed by a resistor divider including a first resistor and a second resistor provided between the output voltage of the voltage regulator and a power-supply voltage, and the second control voltage is approximately K times the output voltage of the voltage regulator where K is a rational number between 0 and 1.

8. The circuit according to claim 7, wherein a resistance of the first resistor is approximately equal to a resistance of the second resistor.

9. The circuit according to claim 6, further comprising a register, wherein in the first mode of operation the register is coupled to the output of the phase frequency detector, the register outputs a control signal to the voltage regulator in accordance with the output of the phase frequency detector and the output voltage of the voltage regulator is based upon the control signal.

10. The circuit according to claim 6, wherein
the clock output by the phase frequency detector comprises an UP signal when the frequency of the feedback clock is lower than the frequency of the reference clock and a DOWN signal when the frequency of the feedback clock is higher than the frequency of the reference clock, and in the first mode of operation the output voltage of the voltage regulator increases when the clock output by the phase frequency detector comprises an UP signal and the output voltage of the voltage regulator decreases when the clock output by the phase frequency detector comprises a DOWN signal.

11. A circuit, comprising:
a voltage regulator configured to provide an output voltage;
a phase frequency detector configured to compare phases and frequencies between a reference clock and a feedback clock, and outputs a clock resulting from the comparison on an output;

a first charge pump configured to output an electric charge in accordance with the output from the phase frequency detector;

a second charge pump configured to output an electric charge in accordance with the output from the phase frequency detector;

a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the first charge pump and the second charge pump in a second mode of operation and switch between the first mode of operation and the second mode of operation;

a first low pass filter configured to store the electric charge injected from the first charge pump to output a first control voltage on an output;

a second low pass filter configured to store the electric charge injected from the second charge pump to output a second control voltage on an output;

a first control-voltage generating circuit configured to output a third control voltage on an output, wherein the third control voltage is obtained by dividing the output voltage of the voltage regulator;

a second control-voltage generating circuit configured to output a fourth control voltage on an output, wherein the fourth control voltage is obtained by dividing the output voltage of the voltage regulator;

a differential voltage controlled oscillator which outputs an output clock;

a second path setting section configured to couple the output of the first control-voltage generating circuit and the output of the second control-voltage generating circuit to the voltage controlled oscillator in the first mode of operation, couple the output of the first low pass filter and the output of the second low pass filter to the voltage controlled oscillator in the second mode of operation and switch between the first mode of operation and the second mode of operation such that the voltage controlled oscillator produces the output clock in accordance with the third control voltage, the fourth control voltage and the output voltage of the voltage regulator in the first mode of operation and produces the output clock in accordance with the first control voltage, the second control voltage and the output voltage of the voltage regulator in the second mode of operation; and a divider which outputs the feedback clock, wherein the feedback clock is obtained by dividing the output clock of the voltage controlled oscillator to the phase frequency detector.

12. The circuit according to claim 11, wherein
the differential voltage controlled oscillator includes a positive control terminal and a negative control terminal, where in the first mode of operation the third control voltage is provided to the positive control terminal and the fourth control voltage is provided to the negative control terminal and in the second mode of operation the first control voltage is provided to the positive terminal and the second control voltage is provided to the negative control terminal.

13. The circuit according to claim 11, wherein
the third control voltage and the fourth control voltage are each formed by corresponding resistor dividers, each resistor divider including a first resistor and a second resistor provided between the output voltage of the corresponding voltage regulator and a power-supply voltage, and
the third control voltage and the fourth control voltage are approximately K times the output voltage of the voltage regulator where K is a rational number between 0 and 1.

14. The circuit according to claim 13, wherein a resistance of the first resistor is approximately equal to a resistance of the second resistor.

15. The circuit according to claim 11, further comprising a register, wherein in the first mode of operation the register is coupled to the output of the phase frequency detector, the register outputs a control signal to the voltage regulator in accordance with the output of the phase frequency detector and the output voltage of the voltage regulator is based upon the control signal.

16. A method of operating a phase locked loop comprising:
switching between a first mode of operation and a second mode of operation based on an event, wherein:
the first mode of operation comprises:
regulating an output voltage of a voltage regulator based upon the output of a phase frequency detector,
providing a second control voltage to a voltage controlled oscillator, wherein the first control voltage is obtained by dividing the output voltage of the voltage regulator, and
producing an output clock from a voltage controlled oscillator in accordance with the first control voltage and the output voltage of the voltage regulator; and
the second mode of operation comprises:
providing the output of a phase frequency detector to a charge pump configured to produce an electric charge in accordance with the output from the phase frequency detector
providing a second control voltage to the voltage controlled oscillator from a low pass filter configured to store the electric charge injected from the charge pump and produce the second control voltage;
providing the output voltage of a voltage regulator to the voltage controlled oscillator; and
producing the output clock from the voltage controlled oscillator in accordance with the second control voltage and the output voltage of the voltage regulator.

17. The method according to claim 16, wherein
the second control voltage is a voltage formed by a resistor divider including a first resistor and a second resistor provided between the output voltage of the voltage regulator and a power-supply voltage, and
the second control voltage is approximately K times the output voltage of the voltage regulator where K is a rational number between 0 and 1.

18. The method according to claim 17, wherein a resistance of the first resistor is approximately equal to a resistance of the second resistor.

19. The method according to claim 16, further comprising providing the output of the phase frequency detector to a register and providing a control signal from the register to the voltage regulator in accordance with the output of the phase frequency detector in the first mode of operation wherein the output voltage of the voltage regulator is based upon the control signal.

20. The method according to claim 16, wherein
the clock output by the phase frequency detector comprises an UP signal when the frequency of the feedback clock is lower than the frequency of the reference clock and a DOWN signal when the frequency of the feedback clock is higher than the frequency of the reference clock, and
in the first mode of operation the output voltage of the voltage regulator increases when the clock output by the phase frequency detector comprises an UP signal and the output voltage of the voltage regulator decreases when the clock output by the phase frequency detector comprises a DOWN signal.

21. A system, comprising:
a CPU configured to produce a mode signal;
a power-supply detecting circuit configured to determine a power-supply voltage and produce the mode signal based upon the determined power-supply voltage; and
a phase locked loop (PLL) circuit which outputs a clock signal based upon the mode signal,
the PLL circuit including:
a voltage regulator configured to provide an output voltage;
a phase frequency detector configured to compare phases and frequencies between a reference clock and a feedback clock, and outputs a clock resulting from the comparison on an output;
a charge pump configured to output an electric charge in accordance with the output from the phase frequency detector;
a first path setting section configured to couple the output of the phase frequency detector to the voltage regulator in a first mode of operation such that the output voltage of the voltage regulator is based on the output of the phase frequency detector in the first mode of operation, couple the output of the phase frequency detector to the charge pump in a second mode of operation and switch between the first mode of operation and the second mode of operation based upon the mode signal;
a low pass filter configured to store the electric charge injected from the charge pump to output a first control voltage on an output;
a control-voltage generating circuit configured to output a second control voltage on an output, wherein the second control voltage is obtained by dividing the output voltage of the voltage regulator;
a voltage controlled oscillator configured to output an output clock;
a second path setting section configured to couple the output of the control-voltage generating circuit to the voltage controlled oscillator in a first mode of operation, couple the output of the low pass filter to the voltage controlled oscillator in a second mode of operation and switch between the first mode of operation and the second mode of operation based upon the mode signal such that the voltage controlled oscillator produces the output clock in accordance with the second control voltage and the output voltage of the voltage regulator in the first mode of operation and the voltage controlled oscillator produces the output clock in accordance with the first control voltage and the output voltage of the voltage regulator in the second mode of operation; and
a divider configured to output the feedback clock, wherein the feedback clock is obtained by dividing the output clock of the voltage controlled oscillator to the phase frequency detector.

22. The system according to claim 21, wherein
the second control voltage is a voltage formed by a resistor divider including a first resistor and a second resistor provided between the output voltage of the voltage regulator and a power-supply voltage, and
the second control voltage is approximately K times the output voltage of the voltage regulator where K is a rational number between 0 and 1.

23. The system according to claim 22, wherein a resistance of the first resistor is approximately equal to a resistance of the second resistor.

24. The system according to claim 21, wherein the PLL circuit further includes a register, wherein in the first mode of operation the register is coupled to the output of the phase frequency detector, the register outputs a control signal to the voltage regulator in accordance with the output of the phase frequency detector and the output voltage of the voltage regulator is based upon the control signal.

25. The system according to claim 21, wherein
the clock output by the phase frequency detector comprises an UP signal when the frequency of the feedback clock is lower than the frequency of the reference clock and a DOWN signal when the frequency of the feedback clock is higher than the frequency of the reference clock, and
in the first mode of operation the output voltage of the voltage regulator increases when the clock output by the phase frequency detector comprises an UP signal and the output voltage of the voltage regulator decreases when the clock output by the phase frequency detector comprises a DOWN signal.

* * * * *